(12) United States Patent
Bertin

(10) Patent No.: US 10,855,303 B1
(45) Date of Patent: Dec. 1, 2020

(54) PROPAGATION DELAY COMPENSATION AND INTERPOLATION FILTER

(71) Applicant: SEMICONDUCTOR COMPONENTS INDUSTRIES, LLC, Phoenix, AZ (US)

(72) Inventor: Jacques Jean Bertin, Pocatello, ID (US)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 0 days.

(21) Appl. No.: 16/820,192

(22) Filed: Mar. 16, 2020

(51) Int. Cl.
| | | |
|---|---|---|
| *H03M 1/12* | (2006.01) | |
| *G01B 7/30* | (2006.01) | |
| *G01B 7/00* | (2006.01) | |
| *H03M 1/48* | (2006.01) | |

(52) U.S. Cl.
CPC ............ *H03M 1/129* (2013.01); *G01B 7/003* (2013.01); *G01B 7/30* (2013.01); *H03M 1/485* (2013.01)

(58) Field of Classification Search
CPC ...... H03M 1/129; H03M 1/485; G01B 7/003; G01B 7/30
USPC .......................................... 341/126, 144, 155
See application file for complete search history.

(56) References Cited

U.S. PATENT DOCUMENTS

| | | | | |
|---|---|---|---|---|
| 10,643,347 | B2 * | 5/2020 | Kotake | ..................... G06T 7/73 |
| 10,645,810 | B2 * | 5/2020 | Rissing | ................. H05K 1/189 |
| 10,684,116 | B2 * | 6/2020 | Hirota | ........................ G06T 7/75 |
| 2017/0131119 | A1 | 5/2017 | Riedmueller | |

\* cited by examiner

*Primary Examiner* — Brian K Young
(74) *Attorney, Agent, or Firm* — The Noblitt Group, PLLC

(57) ABSTRACT

Various embodiments provide a filter for propagation delay compensation and interpolation in encoder digital signal processing. The filter can include a first low pass filter configured to reduce noise of a digital input comprising a measured angular position; a first differentiator configured to receive a filtered digital input and to calculate a speed from a difference in time of the measured angular position and a previous angular position; a second low pass filter configured to reduce noise from the speed; a second differentiator configured to receive a filtered speed and to calculate acceleration using a difference in time of the filtered speed and a previous speed; a third low pass filter configured to reduce noise of the acceleration; and a delay compensator configured to receive the filtered digit input, the filtered speed, and a filtered acceleration, and to calculate a propagation delay compensated digital output.

20 Claims, 7 Drawing Sheets

PROPAGATION DELAY COMPENSATION AND INTERPOLATION FILTER

BACKGROUND

Digital encoders are used to control manufacturing robots. Typically, one component of digital encoder is position sensor designed to determine a position of a moving device. For a rotating object, a position sensor measures an angle of the rotating device relative to a start position. The position sensor provides an analog signal to a signal processing component of the digital encoder. The signal processing component receives the analog and outputs a digital signal of the angle position relative to time. The signal processing component can include an analog signal processor, an analog to digital convertor, and a digital signal processor. A propagation time for processing the signal may delay the output of the digital signal from the encoder and provide an inaccurate angle position as compared to the real time angle position of the rotating object.

One solution, to compensate for this propagation time delay, is to use a system with two position sensors, each measuring the angle of the rotating object. The pair of signals from the sensors is input into a parallel two filter circuit, which that provides a feedback loop to compensate for the time delay. This solution is known to be susceptible to instability. In addition, this solution is limited by the feedback loop to compensate the time delay over a small dynamic range.

New solutions are needed to provide an accurate angle position relative to time for a rotating object.

SUMMARY

Various embodiments of the present invention provide a filter for propagation delay compensation and interpolation in encoder digital signal processing providing angle, speed, and acceleration.

In some embodiments, a propagation delay compensation circuit can include a first low pass filter configured to receive a digital input and to reduce noise of the digital input comprising a measured angular position; a first differentiator configured to receive a filtered digital input comprising a measured angular position and to calculate a speed from a difference in time of the measured angular position and a previous angular position; a second low pass filter configured to reduce noise from the speed; a second differentiator configured to receive a filtered speed and to calculate acceleration using a difference in time of the filtered speed and a previous speed; a third low pass filter configured to reduce noise of the acceleration; and a delay compensator configured to receive the filtered digit input, the filtered speed, and a filtered acceleration, and to calculate a propagation delay compensated digital output.

Some embodiments provide methods of calculating propagation delay compensation. A method can include receiving a digital input comprising a measured angular position of a rotating object; reducing noise of the digital input comprising a measured angular position; calculating a speed from a difference in time of the filtered measured angular position and a previous angular position; reducing noise from the speed; calculating an acceleration using a difference in time of a filtered speed and a previous speed; reducing noise of the acceleration; receiving the filtered measured angular position, the filtered speed, and a filtered acceleration in a delay compensator; and calculating, in the a delay compensator, a propagation delay compensated digital output.

DRAWINGS

The present disclosure will become more fully understood from the description and the accompanying drawings, wherein.

Figure 1:
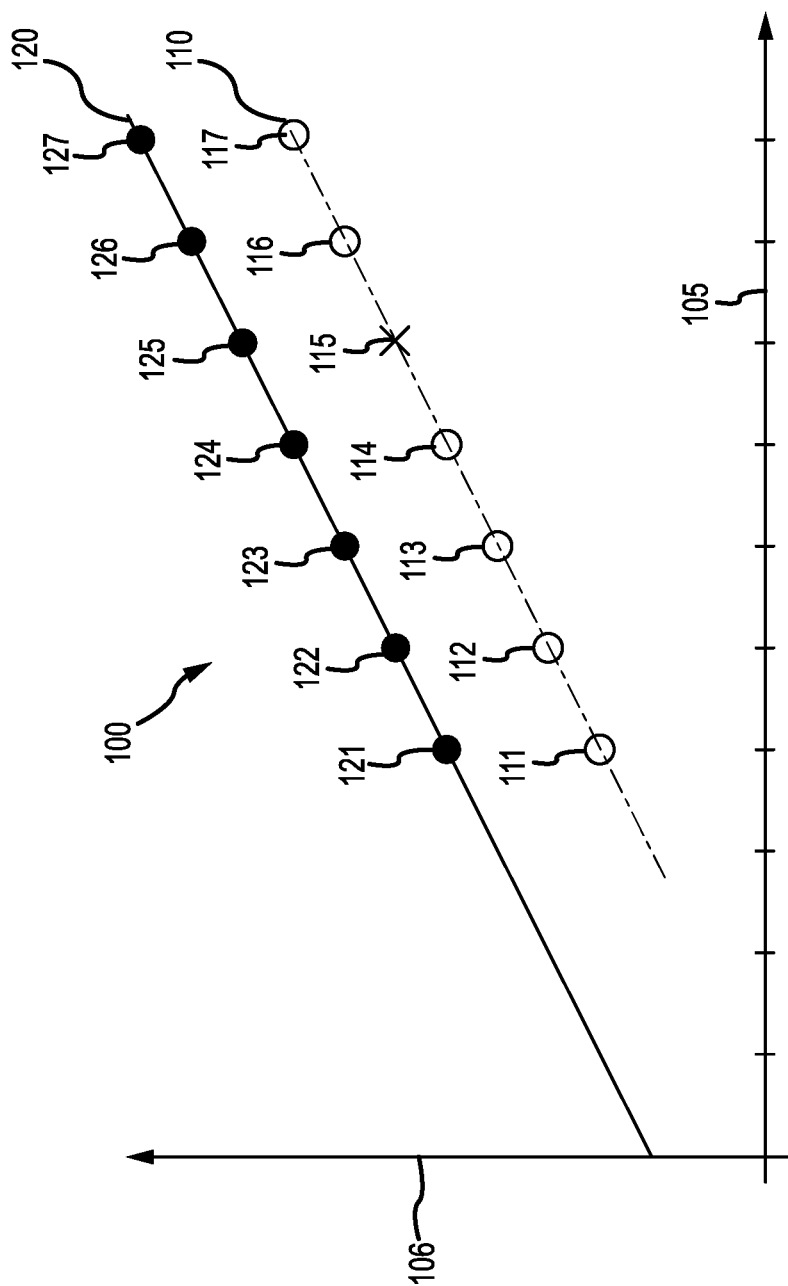
FIG. 1 is a graph illustrating measurement output of the prior art.

The drawings described herein are for illustrative purposes only of selected embodiments and not all possible implementations, and are not intended to limit the scope of any of the exemplary embodiments disclosed herein or any equivalents thereof. It is understood that the drawings are not drawn to scale. For purposes of clarity, the same reference numbers will be used in the drawings to identify similar elements.

DESCRIPTION

The following disclosure is merely exemplary in nature and is in no way intended to limit the described embodiments, their application, or uses. The present invention has been described with reference to various exemplary embodiments. Various modifications and changes may be made to an exemplary embodiment without departing from the scope of the present invention and all such modifications are intended to be included within the scope of the present invention.

For a rotating device, a position sensor, such as, for example, an angular sensor interface, targets the device and measures an angular position of the rotating device relative to a start position. Typically, the output angle of the sensor interface will exhibit an angle error due to a propagation delay in the analog signal processing and the delay in the digital signal processing following the analog to digital conversion in an encoder. If the sensor interface is noisy, additional digital low pass filtering or averaging is advantageous, however, such processing adds to the propagation delay. In addition, an increase in the rotation speed of the object increases the amplitude of the error of the angle measured by the sensor interface.

Using a constant angular velocity to simplify the problem, this propagation delay is illustrated in FIG. 1. Graph 100 has an x-axis 105 of time and a y-axis 106 of angle position of the rotating object. Plot 110 illustrates an output of a series of calculated data points 111, 112, 113, 114, 115, 116, 117 of the angle position of the rotating object at a certain time. To complicate matters, data point 115 has been determined to be invalid. However, plot 120 illustrates the actual position and time of the series of data points 121, 122, 123, 124, 125, 126, 127.

The shift to right of the actual data points in plot 120 to the output of the calculated data points in plot 110 is due to the propagation delay of the processing the analog signal from the sensor, converting the analog signal to a digital signal, processing the digital signal, and outputting a digital signal of the angle position. Due to the problem of propagation delay, as illustrated in FIG. 1, the output to position of the rotating object in plot 110 does not accurately represent the actual position of the rotating object in plot 120. Although the propagation delay may be only a few milliseconds, the inaccurate position of the output can limit the ability of a robot to fabricate micro-assemblies.

Various embodiments, described herein, provide a filter for propagation delay compensation and interpolation in encoder digital signal processing providing angle, speed, and acceleration. The propagation delay compensation and interpolation filter can provide an accurate output of angle position in real time. The propagation delay compensation and interpolation filter can be configured for interpolating and comparing to a new data point to determine if the new data point is valid. In addition, propagation delay compensation and interpolation filter can be configured for up-sampling, which replaces an invalid data point with an extrapolated data point calculated by the filter.

The input into the propagation delay compensation and interpolation filter is the processed digital signal from an encoder and the output from propagation delay compensation and interpolation filter is the actual angle position measured by the position sensor.

The propagation delay compensation and interpolation filter has applications for position sensors, angular sensor interfaces and digital encoders. In addition, various embodiments provide methods and systems that reduce this error by extracting the speed and acceleration and compensating for the delays in the analog and digital blocks.

In some configurations, the propagation delay compensation and interpolation filter is a post-processing digital filter. For example, an input of the filter is a pre-processed digital angle, which can be noisy and have a delay from pre-processing propagation. The filter can remove the noise, however, this adds to the delay. The filter comprises a series of low pass filters and differentiators to calculate low noise angular speed and acceleration. Assuming that the acceleration is constant, or changes slowly, the filter can compensate for all the delays of the sensor signal pre-processing and the delays added by the filter. For example, delays from analog and digital processing are known by the design and can be proportional to an on-chip RC time constant. As shown mathematically herein, two coefficients are enough to calculate the actual angle, free of propagation delay, by adding a correction proportional to the measured speed and acceleration. Once the acceleration is determined, the filter can extrapolate the future speed and angle. Since the output angle can be sampled at a faster rate that the input angle, the extrapolation of a future speed and angle can be used for interpolation. For example, the extrapolation can also be used for signal integrity verification. In case the input angle is not calculated or is not valid, an extrapolation value can be used to replace such an input angle.

Figure 2:
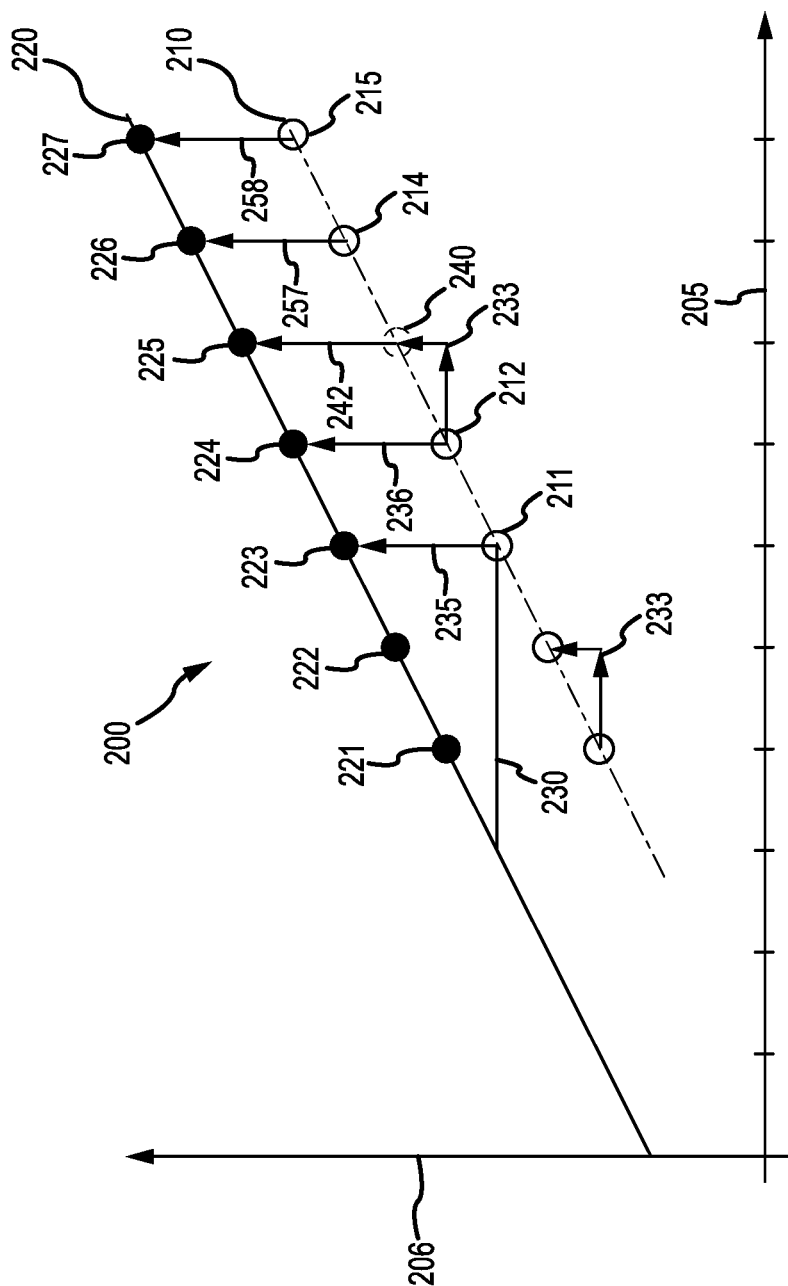
FIG. 2 is a graph illustrating measurement output corrected by a propagation delay compensation filter, in accordance with various embodiments.

As illustrated in FIG. 2, an example of the problem of propagation delay error is corrected by an embodiment of a propagation delay compensation and interpolation filter. Graph 200 has an x-axis 205 of time and a y-axis 206 of angle position of the rotating object. Plot 210 illustrates an output of a calculated speed as defined by a series of calculated data points 211, 212, 213, 214, 215 of the angle position of the rotating object at a certain time. A propagation delay 230 has shifted the calculated speed to the right of the actual speed as shown by plot 220. The output of plot 210 is the input to propagation delay compensation and interpolation filter, which outputs corrected speed of plot 220. As described herein, the filter determines a speed and acceleration 233, which is used to correct 235 calculated data point 211 and output corrected data point 221. Further, the filter can correct 236 calculated data point 212 and output corrected data point 222, correct 237 calculated data point 214 and output corrected data point 224, and correct 238 calculated data point 215 and output corrected data point 225.

However, data point 213 has been determined to be invalid. The filter determines a speed and acceleration 240 and extrapolates a value which is used for data point 213, then corrects 242 extrapolated data point 213 and outputs corrected data point 223. In some embodiments, plot 220 is the corrected speed, which is the actual speed of the rotating object.

If the speed is known or measured and the propagation delay is known, the processed digital signal from an encoder can be corrected by the propagation delay compensation and interpolation filter for delay and/or missing data points. Accordingly, the output the propagation delay compensation and interpolation filter in plot 220 accurately represents the position and speed of the rotating object measured by the encoder.

Figure 3:
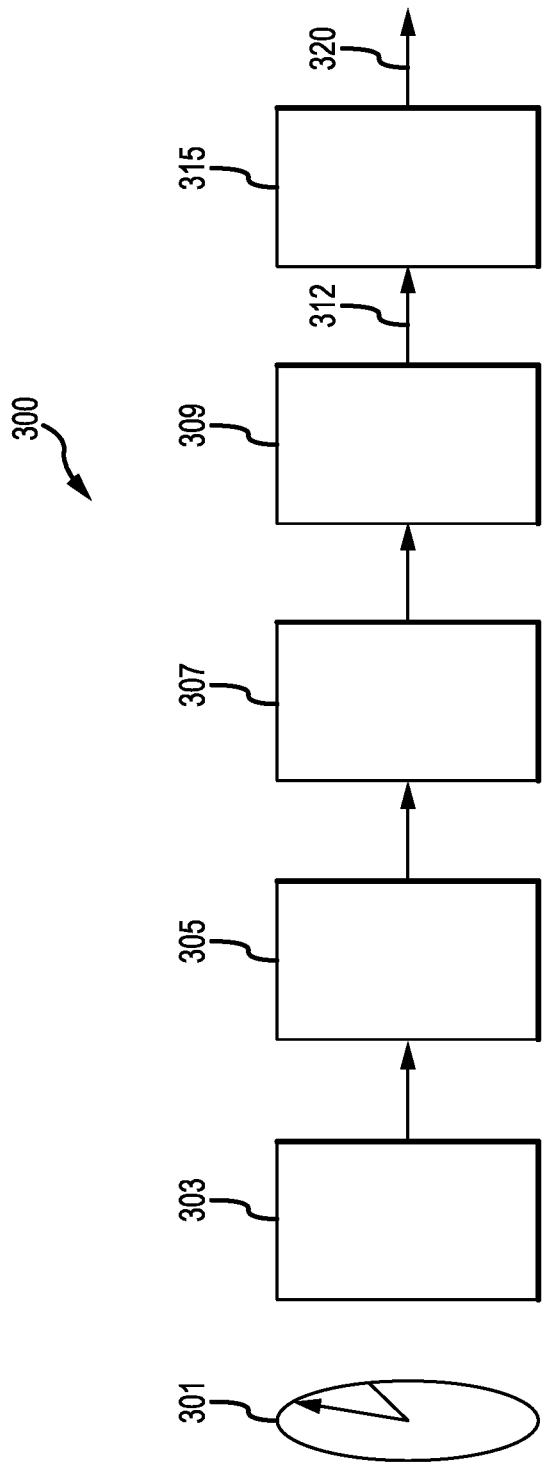
FIG. 3 is a block diagram illustrating a measurement system, in accordance with various embodiments.

Now moving to FIG. 3, a block diagram illustrates an exemplary measurement system 300. For example, the measurement system 300 can be a digital encoder used to control a manufacturing robot. The measurement system 300 can be in communication with or incorporated into any control processor requiring an input of angular positions, which are accurate in both time and space. The measurement system 300 is particularly advantageous for the high sampling rates necessary when measuring an object rotating at high speeds, for example over 6000 rpm. In one application, the measurement system 300 is incorporated into an electric motor.

The measurement system 300 is designed to measure an angular position of the rotating object 301 and calculate the angular position expressed as a propagation delay compensated digital output 320. The sensor 303 is positioned to measure an angular position of a rotating object 301.

Examples of the sensor 303 configured to measure an angular position of a rotating object 301 are well known in the art. The sensor 303 can be a transducer. For example, a transducer can be configured to convert a physical quantity, such as a position, into another physical quantity, such as an electrical signal. The sensor 303 can be an optical detector. The sensor 303 can be a magnetic detector. The sensor 303 can be an inductive detector. The sensor 303 can be a capacitive detector. The sensor 303 can be a Hall effect detector. If temperature is a variable in the measurement, the sensor 303 can be an infrared detector.

The sensor 303 can communicate with an angular sensor interface, which processes an analog electric signal and converts it into a digital signal. The angular sensor interface can include an analog signal processor 305, a digital converter 307, and a digital signal processor 309, which outputs a processed digital input 312. In some configurations, the angular sensor interface can include a propagation delay compensation filter 315. The electric analog signal processing and conversion into a digital signal by the angular sensor interface creates a propagation delay in time of the signal.

The sensor 303 converts the angular position into an analog signal of an electrical magnitude, which can be, for example, a voltage, a current, an impedance, or a frequency. The angular position as measured by the sensor 303 can be sent as an analog signal to an analog signal processor 305. The noise of analog signal can be reduced by the analog signal processor 305. The analog signal processor 305 processes the analog signal, which conditions the analog signal for digital conversion. Processes used by the analog signal processor 305 can include one or more of amplification, filtering, and multiplexing.

The conditioned analog signal is sent to an analog to a digital converter 307 and the resulting digital signal can be sent to a digital signal processor 309, which processes the digital signal and outputs a processed digital input 312.

The angular position, as represented by the processed digital input 312, is sent to the propagation delay compensation filter 315, which calculates a propagation delay compensated digital output 320. The propagation delay compensation filter 315 can be configured to output a delay compensated angular position angle, speed and acceleration.

Figure 4:
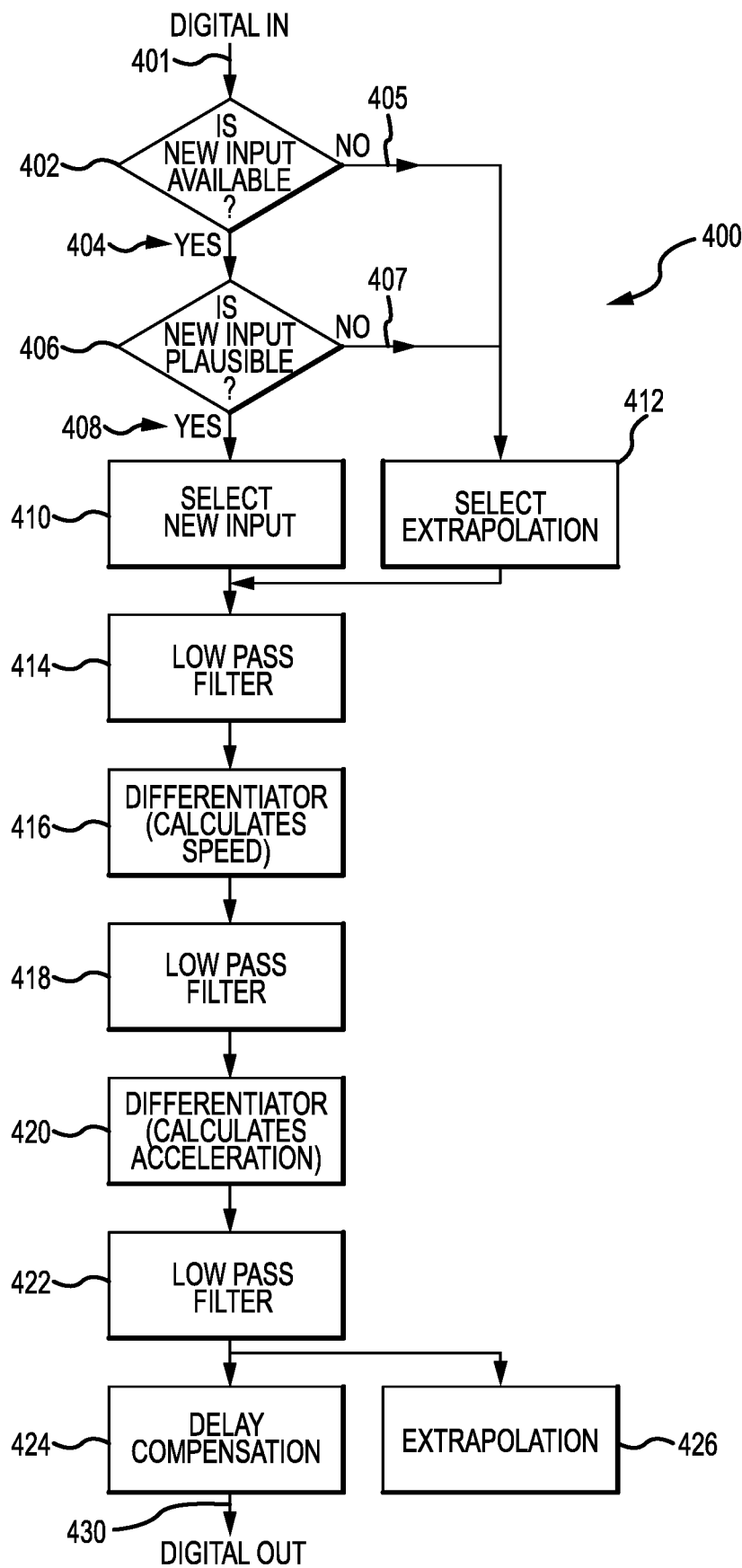
FIG. 4 is a flow chart illustrating an exemplary process for calculating delay compensation, in accordance with various embodiments.

An example of the operation of calculating the propagation delay compensated digital output 320 is illustrated in FIG. 4, as described below.

In some embodiments, the measurement system 300 can comprise a sensor 303 configured to measure an angular position of a rotating object 301; an analog to digital converter 307 configured to receive the angular position and convert the angular position into a digital input 312 comprising a measured angular position; and a propagation delay compensation circuit 315 configured to receive the digital input 312 and to calculate a propagation delay compensated digital output 320.

The propagation delay compensation circuit 315 can be any configuration of a filter for propagation delay compensation and interpolation in encoder digital signal processing, as described herein. The resulting propagation delay compensated digital output 320 can be expressed as a propagation delay compensated measured angular position.

For example, the propagation delay compensation circuit 315 can comprise a first low pass filter configured to receive the digital input 312 comprising the measured angular position and to reduce noise of the measured angular position; a first differentiator configured to receive a filtered measured angular position and to calculate a speed from a difference in time of the filtered measured angular position and a previous angular position; a second low pass filter configured to reduce noise from the speed; a second differentiator configured to receive a filtered speed and to calculate acceleration using a difference in time of the filtered speed and a previous speed; a third low pass filter configured to reduce noise of the acceleration; and a delay compensator configured to receive the filtered digit input, the filtered speed, and a filtered acceleration, and to calculate the propagation delay compensated digital output 320.

Figure 5:
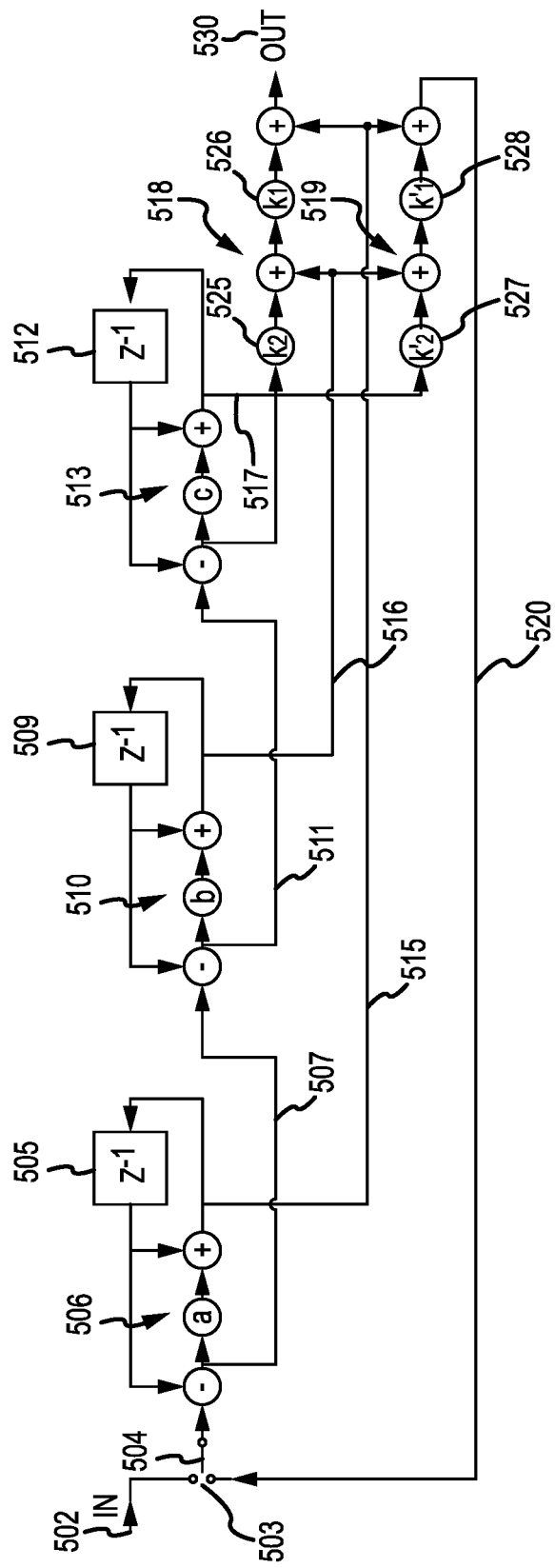
FIG. 5 is a block diagram illustrating an exemplary propagation delay compensation and interpolation circuit, in accordance with various embodiments.

Another example of the propagation delay compensation circuit 315 is illustrated in FIG. 5, as described below.

In some configurations, the measurement system 300 can further comprise an analog signal processor 305 configured to receive the angular position from the sensor 303; process an electrical signal comprising the angular position; and send a processed angular position to the analog to digital converter 315. For example, the process an electrical signal can be at least one of filtering the electrical signal, reducing noise of the electrical signal, amplifying the electrical signal, and multiplexing the electrical signal.

In some configurations, the measurement system 300 can further comprise a digital signal processor 309 configured to receive the digital input comprising the measured angular position; process an digital signal comprising the measured angular position; and send a processed digital input comprising the measured angular position to the propagation delay compensation circuit 315.

Flipping to FIG. 4, a flow chart illustrates an exemplary process for calculating delay compensation. The process 400 begins with an input of a digital signal 401. For example, the digital signal 401 can be the digital input 312, described above. The digital signal 401 comprises the angular position of a rotating object at a certain time. Decision 402: is new input available? If Yes 404, go to Decision 406. If No 405, go to step 412. The digital signal 401 might not be available because it is not calculated yet or is delayed due to a known issue in the previous stages of signal processing. Decision 406: is the new input plausible? If yes 408, go to Step 410, which selects the digital signal 401 for processing. If No 407, go to step 412, which selects an extrapolated value for the process. Since the propagation delay compensation knows the speed and acceleration of the rotating object, the digital signal 401 can be verified that it is close enough to what is expected, for example the digital signal 401 cannot be 180 degrees away from what was extrapolated. If the extrapolated value is selected, the digital signal 401 is discarded.

The selected signal enters a first low pass filter 414, which reduces noise. The signal then enters a first differentiator 416, which determines the speed by calculating the difference in time between successive angular positions. The calculated speed enters a second low pass filter 418, which reduces noise; then enters a second differentiator 420, which determines the acceleration by calculating the difference in time between successive speeds. The calculated acceleration enters a third low pass filter 422, which reduces noise; then enters a delay compensation 424. Based on the measured angle, speed and acceleration the digital output 430 can be compensated for multiple delays between a transducer measuring the angle of the rotating object and the delay compensator 424. Examples of the multiple delays can include a delay in transducer, delay due to analog signal processing, delay for analog to digital conversion, delay due to digital signal processing, delay due to communication to external device, and delay for the process 400. The digital out 430 is the compensated, filtered angle measurement. The extrapolation 426 calculation can be used to compensate for the delay of this process 400 executed in a propagation delay compensation filter.

In some embodiments, a method 400 of calculating propagation delay compensation can include receiving a digital input 401 comprising a measured angular position of a rotating object; reducing noise of the digital input comprising a measured angular position; calculating a speed from a difference in time of the filtered measured angular position and a previous angular position; reducing noise from the speed; calculating an acceleration using a difference in time of a filtered speed and a previous speed; reducing noise of the acceleration; receiving the filtered measured angular position, the filtered speed, and a filtered acceleration in a delay compensator; and calculating, in the a delay compensator 424, a propagation delay compensated digital output 430.

FIG. 5 is a block diagram illustrating exemplary components in a propagation delay compensation and interpolation filter 500. Digital input 502 is a digital representation of the angle with some propagation delay due to analog and digital processing. The digital input 502 enters the filter 500 and is evaluated 503 to determine if the digital input 502 exists and is within a range of acceptability. If the digital input 502 meets the criteria, it is the selected input 504 for processing. If the digital input 502 does not meets the criteria, it is rejected and an extrapolated value 520 becomes the selected input 504. The selected input 504 enters a first low pass filter 505, which reduces noise and produces a low pass filtered angle signal 515. The filtered signal is directed to a first differentiator 506 to determine a calculated speed 507. A second low pass filter 509 receives the calculated speed 507, which reduces noise and produces a low pass filtered speed signal 516. The filtered signal is directed to a second differentiator 510 to determine a calculated acceleration 511. A third low pass filter 512 receives the calculated acceleration 511, which reduces noise and produces a low pass filtered acceleration signal 517.

The filtered angle signal 515, the filtered speed signal 516, and the filtered acceleration signal 517 are directed to a delay compensation circuit 518, which calculates the propagation delay. The delay compensation circuit 518 comprises a first coefficient value 526 ("$k_1$") and a second coefficient value 525 ("$k_2$"), which are further defined in the equations below.

In this example of the filter 500, only first order low pass filters for the angle, speed and acceleration have been used, however, higher order low pass filters can be used.

The filter input can be switched between the digital input 502 and the extrapolated value 520 in case the input signal 502 is determined to be invalid or if up-sampling is performed. Once a new digital input 502 to the filter 500 is available from the pre-processing block it can be compared with the extrapolated angle 520 outputted by the filter. If there is a large difference the new digital input 502 can be discarded and replaced with the extrapolated angle 520. The filter 500 can reject a new digital input 520 that is an outliner or has very noisy inputs. If for some reason a new digital input 502 is not available (for example the analog block is running an auto-zero feature) the extrapolated value 520 is used instead of holding the previous input.

The signal fed back to the input for interpolation or up-sampling uses different compensation coefficients ($k_1^i$ and $k_2^i$) because the digital input 502 is affected by the delay in the previous stage while the extrapolated value 520 is not.

The signal fed back to the input for interpolation or up-sampling uses first extrapolation coefficient 528 ("$k_1'''$") and second extrapolation coefficient 527 ("$k_2'''$"). In one example, the first extrapolation coefficient 528 ("$k_1'''$") can be the first coefficient value 526 ("$k_1$") from the previous digital input and the second extrapolation coefficient 527 ("$k_2'''$") can be the second coefficient value 525 ("$k_2$") from the previous digital input.

In some embodiments, a propagation delay compensation circuit 500 can include a first low pass filter 505 configured to receive a digital input 502 and to reduce noise of the digital input 502 comprising a measured angular position; a first differentiator 506 configured to receive a filtered digital input 515 comprising a measured angular position and to calculate a speed 507 from a difference in time of the measured angular position and a previous angular position; a second low pass filter 509 configured to reduce noise from the speed 507; a second differentiator 510 configured to receive a filtered speed 516 and to calculate acceleration 511 using a difference in time of the filtered speed 516 and a previous speed; a third low pass filter 512 configured to reduce noise of the acceleration 511; and a delay compensator 518 configured to receive the filtered digit input 515, the filtered speed 516, and a filtered acceleration 517, and to calculate a propagation delay compensated digital output 530.

The propagation delay compensation circuit 500 can include an extrapolation generator 519 configured to receive a filtered acceleration 517 and compute an extrapolated angular position 520.

The propagation delay compensation circuit can include a pre-processing block 503 configured to: receive the digital input 502 comprising the measured angular position; determine the measured angular position is in an acceptable range, then send the digital input 502 comprising the measured angular position to the first low band pass filter 505; and determine the measured angular position is not in an acceptable range, then send a digital input comprising the extrapolated angular position 520 to the first low band pass filter 505.

The pre-processing block 503 can be configured to determine the digital input 502 is not received, then send a digital output 504 comprising the extrapolated angular position 520 to the first low band pass filter 505.

The propagation delay compensation circuit 505 can include a pre-processing block 503 configured to: receive the digital input 502 comprising the measured angular position; determine the digital input 502 comprising the measured angular position is received, then send the digital input 502 comprising the measured angular position to the first low band pass filter 505; and determine the digital input 502 comprising the measured angular position is not received, then send a digital input 504 comprising the extrapolated angular position 520 to the first low band pass filter 505.

The propagation delay compensation circuit 500 can include a pre-processing block 503 configured to: receive the digital input 502 comprising the measured angular position; compare the measured angular position and the extrapolated angular position for best fit; and send a digital input 504 comprising the best-fit angular position to the first low band pass filter 505.

In some applications, the propagation delay compensated digital output 530 is a propagation delay compensated measured angular position. In some applications, the propagation delay compensated digital output 530 is a propagation delay compensated extrapolated angular position. In some applications, the propagation delay compensated digital output 530 is the filtered measured angular position The filter 500 can run at a higher sampling frequency than the pre-processing block using the extrapolation feature. This is especially beneficial if the sampling of the sensor output is asynchronous with the internal clock as it reduces the jitter. The filter 500 bandwidth can also be limited if used as an anti-alias filter without introducing additional lag In a non-limiting example of the circuit 500 in operation, the following equations can be used to correct for propagation delay. Assuming constant acceleration and N clocks delay in the signal pre-processing, the position in Z domain sampled at interval T is:

$$IN(Z) = [Acc \ T^2 Z^{-1}(1+Z^{-1})/(1-Z^{-1})^3 + Speed \ TZ^{-1}/(1-Z^{-1})^2 Pos/(1-Z^{-1})]Z^{-N} \qquad (Eq. \ 1)$$

For Equation 1, Acc is acceleration, Pos is position, IN(Z) is the position in the Z domain, and T is the time interval. In the Z domain, Z is the variable. The Z domain requires a fixed sampling time interval T. In this example, Equation 1 calculates the propagation delay.

The first filter determines the average, low pass filtered position, as calculated in Equation 2, where $H_1$ is the transfer function of the noise reduction filter 505 and IN(Z) is from Equation 1:

$$IN_a(Z) = H_1(Z) IN(Z) \quad (Eq. 2)$$

Differentiation and the second filter determines the average speed, as calculated in equation 3, where $H_2$ is the transfer function of the noise reduction filter 509 and $IN_a(Z)$ is from Equation 2:

$$S_a(Z) = (1-Z^{-1}) H_2(Z) IN_a(Z) \quad (Eq. 3)$$

Equation 3 can be re-arranged and expressed as Equation 4:

$$S_a(Z) = (1-Z^{-1}) H_2(Z) H_1(Z) IN(Z) \quad (Eq. 4)$$

Differentiation and the third filter determines the average acceleration, as calculated by Equation 5, where $H_3$ is the transfer function of the noise reduction filter 5012 and $S_a(Z)$ is from Equation 3:

$$A_a(Z) = (1-Z^{-1}) H_3(Z) S_a(Z) \quad (Eq. 5)$$

Equation 5 can be re-arranged and expressed as Equation 6:

$$A_a(Z) = (1-Z^{-1})^2 H_3(Z) H_2(Z) H_1(Z) IN(Z) \quad (Eq. 6)$$

The third filter output is the acceleration, which was assumed to be constant. In various applications, the acceleration can change and the third filter may take some time to settle. Once the third filter is settled the propagation delays can be compensated without any residual error.

The compensated speed is calculated by Equation 7, where $S_a(Z)$ is from Equation 3, $A_a(Z)$ is from Equation 5, and $k_2$ is a coefficient:

$$S_c(Z) = S_a(Z) + k_2 A_a(Z) \quad (Eq. 7)$$

Equation 7 can be re-arranged and expressed as Equation 8:

$$S_c(Z) = [(1-Z^{-1}) + k_2(1-Z^{-1})^2 H_3(Z)] H_2(Z) H_1(Z) IN(Z) \quad (Eq. 8)$$

The compensated position is calculated by Equation 9, where $IN_a(Z)$ is from Equation 2, $S_c(Z)$ is from Equation 7, and $k_1$ is a coefficient:

$$OUT(Z) = IN_a(Z) + k_1 S_c(Z) \quad (Eq. 9)$$

Equation 9 can be re-arranged and expressed as Equation 10:

$$OUT(Z) = H_1(Z) IN(Z) + k_1 ((1-Z^{-1}) H_2(Z) H_1(Z) IN(Z) + k_2 (1-Z^{-1})^2 H_3(Z) H_2(Z) H_1(Z) IN(Z)) \quad (Eq. 10)$$

Equation 9 can be re-arranged and expressed as Equation 11:

$$OUT(Z) = [1 + k_1(1-Z^{-1}) H_2(Z) + k_1 k_2(1-Z^{-1})^2 H_3(Z) H_2(Z)] H_1(Z) IN(Z) \quad (Eq. 11)$$

The Error between the filter output and the actual position (N clocks before the filter input) is:

$$E(Z) = OUT(Z) - IN(Z) Z^N \quad (Eq. 12)$$

The coefficients $k_1$ and $k_2$ can be inserted into Equation 12 and expressed as Equation 13:

$$E(Z) = [H_1(Z) + k_1(1-Z^{-1}) H_2(Z) H_1(Z) + k_1 k_2 (1-Z^{-1})^2 H_3(Z) H_2(Z) H_1(Z) - Z^N] IN(Z) \quad (Eq. 13)$$

Equation 13 calculates the error dynamic for any rotor movement. Next, determine the coefficients $k_1$ and $k_2$ as the error converges to 0, assuming a constantly accelerated rotor. The error will settle to zero when:

$$\lim_{Z \to 1} (1-Z^{-1}) E(Z) = 0 \quad (Eq. 14)$$

Accordingly, 3 conditions are needed to solve the $k_1$ and $k_2$ coefficients:

Condition 1. Acceleration=0, Speed=0, and Position≠0
$\lim_{Z \to 1}(1-Z^{-1}) E(Z) = 0$ implies $H_1(1) = 1$, implies the first filter must have a DC gain of 1.

Condition 2. Acceleration=0, Speed≠0, Position≠0

$$\lim_{Z \to 1}(1-Z^{-1}) E(Z) = 0, \text{ implies } k_1 = (N - d\{H_1(1)\})/H_2 \quad (1)$$

Condition 3. Acceleration≠0, Speed≠0, Position≠0
$\lim_{Z \to 1} (1-Z^{-1}) E(Z) = 0$, implies
$k_2 = [N^2 + N - d^2 \{H_1(1)\} - 2 d\{H_1(1)\} - 2 k_1 d\{H_2(1) H_1(1)\}] / [2 H_3(1) (N - d\{H_1(1)\})]$ where: $d\{H_1(1)\}$ is the derivative of $H_1(Z)$ at $Z=1$;

The coefficients ($k_1$ and $k_2$) can be solved using the equations above. The signal fed back to the input for interpolation or up-sampling uses different compensation coefficients ($k_1^i$ and $k_2^i$), which can be coefficients ($k_1$ and $k_2$) from the previous digital input. For interpolation, there is no propagation delay N due because the signal does not include signal processing and digital conversion delays from an angular sensor interface.

In the Z domain the filter is represented as a multiplication factor containing the variable Z. For example, the digital register 505 is updated every T seconds. If the output of 505 is the input delayed by T seconds, in the Z domain that digital delay is noted as $Z^{-1}$. In this example, OUTregister(Z) = $Z^{-1}$ INregister(Z).

To calculate the difference between the input at time t and the previous input at time t-T, the equation is: OUT(Z) = IN(Z) - $Z^{-1}$ IN(Z) or OUT(Z) = $(1-Z^{-1})$IN(Z). The factor, $(1-Z^{-1})$, which can be referred as a transfer function, is a filter performing a difference in time. More complex transfer functions, or filters, can be designed and are represented generically as $H_n(Z)$.

In the time domain t is the variable, representing the time in seconds. In the time domain the input 500 is IN(t). In the time domain the equations become quickly become very complex and impossible to decipher.

In some applications, the coefficients ($k_1$ and $k_2$) can be determined using top level simulations. In some applications, the coefficients ($k_1$ and $k_2$) can be determined by building a test model and taking bench measurements to solve for the coefficients.

Figure 6:
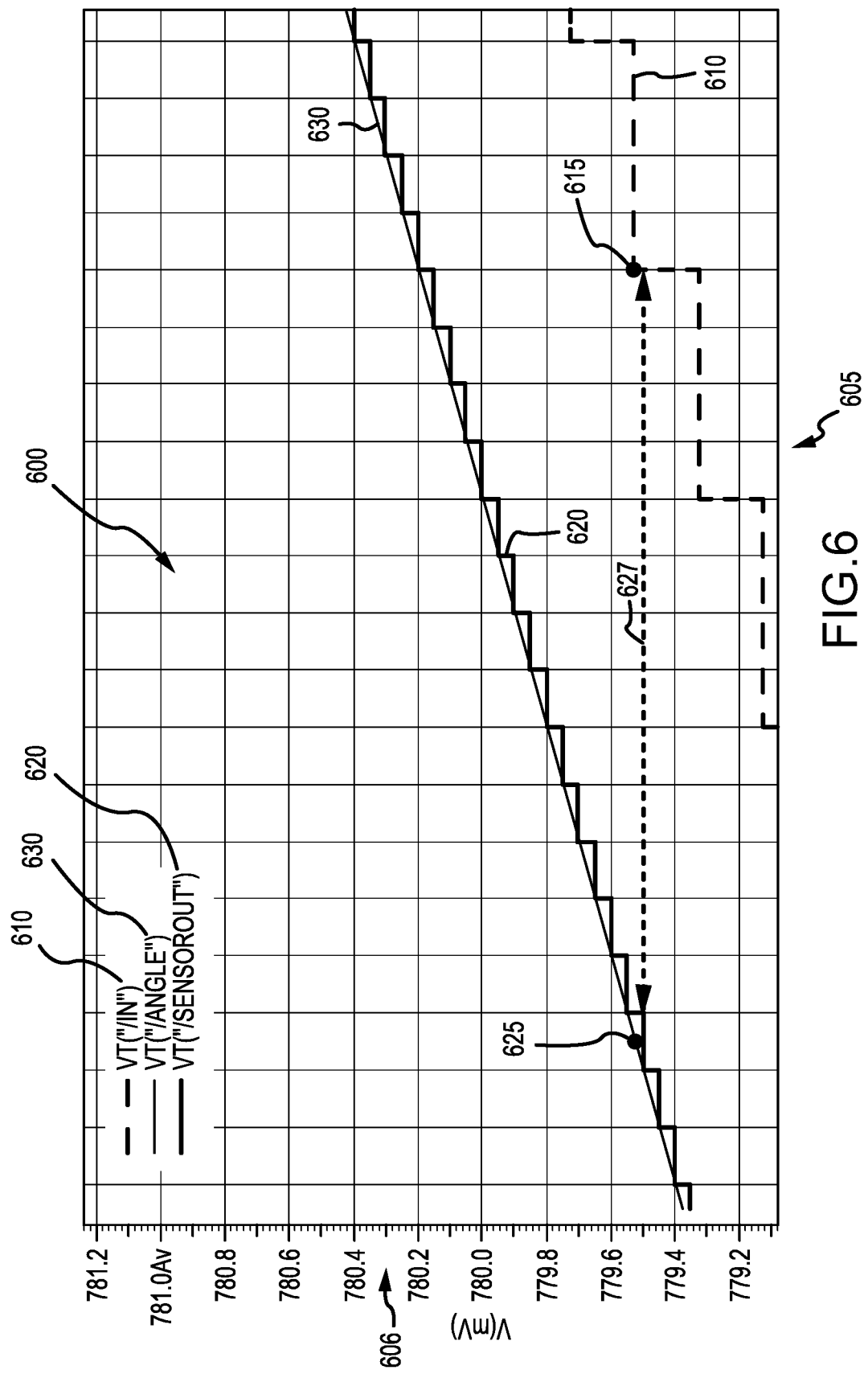
FIG. 6 is a graph illustrating exemplary propagation delay compensated angular measurements, in accordance with various embodiments.

Now turning to FIG. 6, a graph 600 illustrates an example comparing an input 610 into a propagation delay compensation and interpolation filter and the resulting output 620. The graph 600 has an x-axis 605 of time in milliseconds (not shown on FIG. 6) and a y-axis 606 of position in millivolts. The output 620 can be represented as a line, which is the angle 630. A delay compensation for a communication delay between the sensor and a master system can also be calculated.

In this example, the pre-processed signal input 610 is delayed by 6.75 μs due to the analog and digital front-end. The front-end sampling period is 2 μs. The output 620 is compensated for the delay and up-sampled by a factor 4. With the right coefficients each data point of output 620 is exactly aligned with the rotor position of the rotating object. For example, data point 615 of input 610 has a propagation delay 627 and is corrected to data point 625 of output 620. In this example, the input data point 615 is 9.6355 ms, 779.53 mV; the corrected data point 625 is 9.62875 ms. 779.53 mV; and the propagation delay 627 is 6.75 The speed is 311.001 mV/s.

Figure 7:
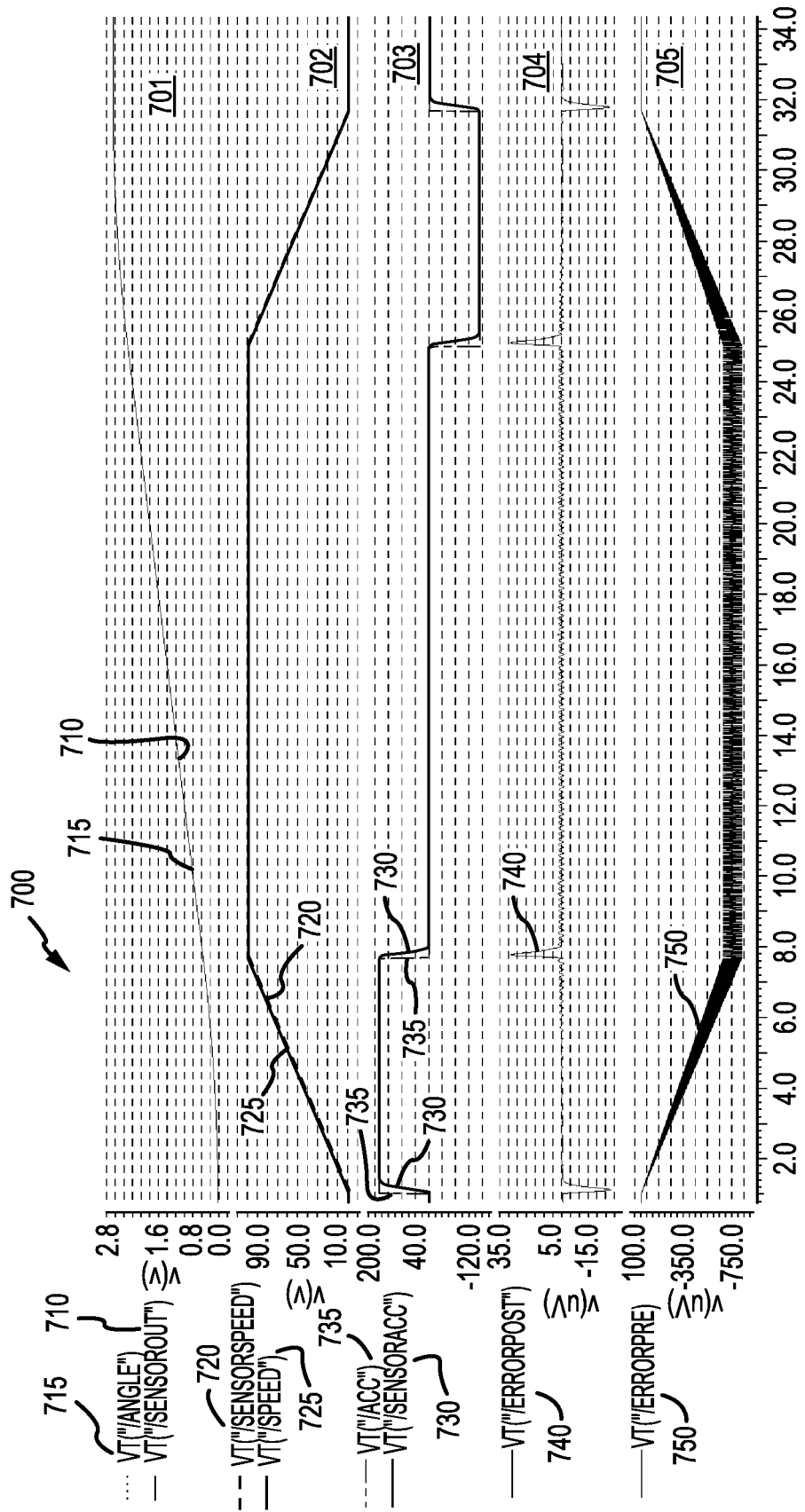
FIG. 7 is a composite graph illustrating data calculated from exemplary measurements of a rotating object at various conditions, in accordance with various embodiments.

Finally, FIG. 7 illustrates a composite graph 700 showing data from an exemplary simulation overlaid on the same time scale. In graph 701, SensorOut 710, which is the output of a propagation delay compensation and interpolation filter, overlays exactly with Angle 715, which is the actual rotor position. In graph 702, SensorSpeed 720, which is the calculated speed from the propagation delay compensation and interpolation filter, overlays Speed 725 which is the actual speed of the rotor. In graph 702, acceleration can be constant, which produces and exact speed and exact position. In graph 703, increases and decreases in SensorAcc 730, which is the calculated acceleration from the propagation delay compensation and interpolation filter, is slightly delayed from Acc 735, which is the actual acceleration of the rotor. In graph 704, ErrorPost 740, which is the sensor error after filter post-processing, illustrates the error post processing, which predominately correlates to slight delay of the calculated acceleration compared to the actual acceleration. The calculated post processing error is <+/−35 uV/1V=<+/− 12.6 mdeg/360deg. In graph 705, ErrorPre 750, which is the sensor error before delay compensation, illustrates the significant error of angle measurements that can be eliminated by use of the propagation delay compensation and interpolation filter. The calculated sensor error before delay compensation is +/−750 uV/1V=+/−270 mdeg/360deg.

In some embodiments, a propagation delay compensation circuit can include a first low pass filter configured to receive a digital input and to reduce noise of the digital input comprising a measured angular position; a first differentiator configured to receive a filtered digital input comprising a measured angular position and to calculate a speed from a difference in time of the measured angular position and a previous angular position; a second low pass filter configured to reduce noise from the speed; a second differentiator configured to receive a filtered speed and to calculate acceleration using a difference in time of the filtered speed and a previous speed; a third low pass filter configured to reduce noise of the acceleration; and a delay compensator configured to receive the filtered digit input, the filtered speed, and a filtered acceleration, and to calculate a propagation delay compensated digital output.

The propagation delay compensation circuit can include an extrapolation generator configured to receive a filtered acceleration and compute an extrapolated angular position.

The propagation delay compensation circuit can include a pre-processing block configured to: receive the digital input comprising the measured angular position; determine the measured angular position is in an acceptable range, then send the digital input comprising the measured angular position to the first low band pass filter; and determine the measured angular position is not in an acceptable range, then send a digital input comprising the extrapolated angular position to the first low band pass filter.

The pre-processing block can be configured to determine the digital input is not received, then send a digital output comprising the extrapolated angular position to the first low band pass filter.

The propagation delay compensation circuit can include a pre-processing block configured to: receive the digital input comprising the measured angular position; determine the digital input comprising the measured angular position is received, then send the digital input comprising the measured angular position to the first low band pass filter; and determine the digital input comprising the measured angular position is not received, then send a digital input comprising the extrapolated angular position to the first low band pass filter.

The propagation delay compensation circuit can include a pre-processing block configured to: receive the digital input comprising the measured angular position; compare the measured angular position and the extrapolated angular position for best fit; and send a digital input comprising the best-fit angular position to the first low band pass filter.

In some applications, the propagation delay compensated digital output is a propagation delay compensated measured angular position. In some applications, the propagation delay compensated digital output is a propagation delay compensated extrapolated angular position. In some applications, the propagation delay compensated digital output is the filtered measured angular position In some embodiments, a system can include a sensor configured to measure an angular position of a rotating object; an analog to digital converter configured to receive the angular position and convert the angular position into a digital input comprising a measured angular position; and a propagation delay compensation circuit comprising: a first low pass filter configured to receive the digital input comprising the measured angular position and to reduce noise of the measured angular position; a first differentiator configured to receive a filtered measured angular position and to calculate a speed from a difference in time of the filtered measured angular position and a previous angular position; a second low pass filter configured to reduce noise from the speed; a second differentiator configured to receive a filtered speed and to calculate acceleration using a difference in time of the filtered speed and a previous speed; a third low pass filter configured to reduce noise of the acceleration; and a delay compensator configured to receive the filtered digit input, the filtered speed, and a filtered acceleration, and to calculate a propagation delay compensated digital output.

The system can include an analog signal processor configured to receive the angular position from the sensor; process an electrical signal comprising the angular position; and send a processed angular position to the analog to digital converter. The processing an electrical signal can include any one of or any combination of: filtering the electrical signal, reducing noise of the electrical signal, amplifying the electrical signal, and multiplexing the electrical signal The system can include a digital signal processor configured to receive the digital input comprising the measured angular position; process a digital signal comprising the measured angular position; and send a processed digital input comprising the measured angular position to the propagation delay compensation circuit.

The sensor can be a transducer, an optical detector, a magnetic detector, an inductive detector, a capacitive detector, or a Hall effect detector. The propagation delay compensated digital output can be a propagation delay compensated measured angular position.

In some embodiments, a method of calculating propagation delay compensation can include receiving a digital input comprising a measured angular position of a rotating object; reducing noise of the digital input comprising a measured angular position; calculating a speed from a difference in time of the filtered measured angular position and a previous angular position; reducing noise from the speed; calculating an acceleration using a difference in time of a filtered speed and a previous speed; reducing noise of the acceleration; receiving the filtered measured angular position, the filtered speed, and a filtered acceleration in a delay compensator; and calculating, in the a delay compensator, a propagation delay compensated digital output.

The method can include comparing the measured angular position to a previous angular position of the rotating object; determining the measured angular position is not valid based on the comparing; and replacing the measured angular position with an extrapolated angular position based on the previous angular position.

The method can include collecting an angular position with a sensor; sending an analog signal comprising the measured angular position to an analog to digital converter; and converting the analog signal into a digital output comprising the measured angular position.

The method can include sending the propagation delay compensated digital output is a controller. In some applications of the method, the propagation delay compensated digital output is a propagation delay compensated measured angular position.

In the foregoing description, the present invention has been described with reference to specific exemplary embodiments. The particular implementations shown and described are illustrative of the present invention and its best mode and are not intended to otherwise limit the scope of the present invention in any way. Indeed, for the sake of brevity, conventional manufacturing, connection, preparation, and other functional aspects of the method and system may not be described in detail. Furthermore, the connecting lines shown in the various figures are intended to represent exemplary functional relationships and/or steps between the various elements. Many alternative or additional functional relationships or physical connections may be present in a practical system.

It should be understood that steps within a method may be executed in different order without altering the principles of the present disclosure. For example, various embodiments may be described herein in terms of various functional components and processing steps. It should be appreciated that such components and steps may be realized by any number of hardware components configured to perform the specified functions.

Additionally, the components and/or elements recited in any apparatus embodiment may be assembled or otherwise operationally configured in a variety of permutations to produce substantially the same result as the present technology and are accordingly not limited to the specific configuration recited in the specific examples.

As used herein, the phrase "at least one of A, B, and C" can be construed to mean a logical (A or B or C), using a non-exclusive logical "or," however, can be contrasted to mean (A, B, and C), in addition, can be construed to mean (A and B) or (A and C) or (B and C). As used herein, the phrase "A, B and/or C" should be construed to mean (A, B, and C) or alternatively (A or B or C), using a non-exclusive logical "or."

The present invention has been described above with reference to various exemplary embodiments and examples, which are not intended to be limiting in describing the full scope of systems and methods of this invention. However, those skilled in the art will recognize that equivalent changes, modifications and variations of the embodiments, materials, systems, and methods may be made within the scope of the present invention, with substantially similar results, and are intended to be included within the scope of the present invention, as set forth in the following claims.

The invention claimed is:

1. A propagation delay compensation circuit comprising:
a first low pass filter configured to receive a digital input and to reduce noise of the digital input comprising a measured angular position;
a first differentiator configured to receive a filtered digital input comprising the measured angular position and to calculate a speed from a difference in time of the measured angular position and a previous angular position;
a second low pass filter configured to reduce noise from the speed;
a second differentiator configured to receive a filtered speed and to calculate acceleration using a difference in time of the filtered speed and a previous speed;
a third low pass filter configured to reduce noise of the acceleration; and
a delay compensator configured to receive the filtered digit input, the filtered speed, and a filtered acceleration, and to calculate a propagation delay compensated digital output.

2. The propagation delay compensation circuit according to claim 1, further comprising an extrapolation generator configured to receive a filtered acceleration and compute an extrapolated angular position.

3. The propagation delay compensation circuit according to claim 2, further comprising a pre-processing block configured to:
receive the digital input comprising the measured angular position;
determine the measured angular position is in an acceptable range, then send the digital input comprising the measured angular position to the first low band pass filter; and
determine the measured angular position is not in an acceptable range, then send a digital input comprising the extrapolated angular position to the first low band pass filter.

4. The propagation delay compensation circuit according to claim 3, wherein the pre-processing block is configured to determine the digital input is not received, then send a digital output comprising the extrapolated angular position to the first low band pass filter.

5. The propagation delay compensation circuit according to claim 2, further comprising a pre-processing block configured to:
receive the digital input comprising the measured angular position;
determine the digital input comprising the measured angular position is received, then send the digital input comprising the measured angular position to the first low band pass filter; and
determine the digital input comprising the measured angular position is not received, then send a digital input comprising the extrapolated angular position to the first low band pass filter.

6. The propagation delay compensation circuit according to claim 2, further comprising a pre-processing block configured to:
receive the digital input comprising the measured angular position;
compare the measured angular position and the extrapolated angular position for best fit; and
send a digital input comprising the best-fit angular position to the first low band pass filter.

7. The propagation delay compensation circuit according to claim 1, wherein the propagation delay compensated digital output is a propagation delay compensated measured angular position.

8. The propagation delay compensation circuit according to claim 2 wherein the propagation delay compensated digital output is a propagation delay compensated extrapolated angular position.

9. The propagation delay compensation circuit according to claim 1, wherein the propagation delay compensated digital output is the filtered measured angular position.

10. A system comprising:
a sensor configured to measure an angular position of a rotating object;
an analog to digital converter configured to receive the angular position and convert the angular position into a digital input comprising a measured angular position; and
a propagation delay compensation circuit comprising:
a first low pass filter configured to receive the digital input comprising the measured angular position and to reduce noise of the measured angular position;
a first differentiator configured to receive a filtered measured angular position and to calculate a speed from a difference in time of the filtered measured angular position and a previous angular position;
a second low pass filter configured to reduce noise from the speed;
a second differentiator configured to receive a filtered speed and to calculate acceleration using a difference in time of the filtered speed and a previous speed;
a third low pass filter configured to reduce noise of the acceleration; and
a delay compensator configured to receive the filtered digit input, the filtered speed, and a filtered acceleration, and to calculate a propagation delay compensated digital output.

11. The system according to claim 10, further comprising an analog signal processor configured to receive the angular position from the sensor; process an electrical signal comprising the angular position; and send a processed angular position to the analog to digital converter.

12. The system according to claim 11, wherein the process an electrical signal is at least one of filtering the electrical signal, reducing noise of the electrical signal, amplifying the electrical signal, and multiplexing the electrical signal.

13. The system according to claim 10, further comprising a digital signal processor configured to receive the digital input comprising the measured angular position; process an digital signal comprising the measured angular position; and send a processed digital input comprising the measured angular position to the propagation delay compensation circuit.

14. The system according claim 10, wherein the sensor comprises a transducer, an optical detector, a magnetic detector, an inductive detector, a capacitive detector, or a Hall effect detector.

15. The system according to claim 10, wherein the propagation delay compensated digital output is propagation delay compensated measured angular position.

16. Method of calculating propagation delay compensation, the method comprising:
receiving a digital input comprising a measured angular position of a rotating object;
reducing noise of the digital input comprising the measured angular position;
calculating a speed from a difference in time of the filtered measured angular position and a previous angular position;
reducing noise from the speed;
calculating an acceleration using a difference in time of a filtered speed and a previous speed;
reducing noise of the acceleration;
receiving the filtered measured angular position, the filtered speed, and a filtered acceleration in a delay compensator; and
calculating, in the a delay compensator, a propagation delay compensated digital output.

17. The method according to claim 16, further comprising:
comparing the measured angular position to a previous angular position of the rotating object;
determining the measured angular position is not valid based on the comparing; and
replacing the measured angular position with an extrapolated angular position based on the previous angular position.

18. The method according to claim 16, further comprising:
collecting an angular position with a sensor;
sending an analog signal comprising the measured angular position to an analog to digital converter; and
converting the analog signal into a digital output comprising the measured angular position.

19. The method according to claim 16 further comprising sending the propagation delay compensated digital output is a controller.

20. The method according to claim 16, wherein the propagation delay compensated digital output is a propagation delay compensated measured angular position.

* * * * *